(12) United States Patent
Cartier et al.

(10) Patent No.: US 7,183,604 B2
(45) Date of Patent: Feb. 27, 2007

(54) HIGH DIELECTRIC CONSTANT DEVICE

(75) Inventors: Eduard Cartier, Leuven (BE); Jerry Chen, Leuven (BE); Chao Zhao, Kessel-lo (BE)

(73) Assignee: Interuniversitair Microelektronica Centrum (IMEC vzw), Leuven (BE)

( * ) Notice: Subject to any disclaimer, the term of this patent is extended or adjusted under 35 U.S.C. 154(b) by 229 days.

(21) Appl. No.: 10/459,360

(22) Filed: Jun. 10, 2003

(65) Prior Publication Data
US 2004/0028952 A1 Feb. 12, 2004

Related U.S. Application Data

(60) Provisional application No. 60/387,487, filed on Jun. 10, 2002.

(51) Int. Cl.
*H01L 29/94* (2006.01)
(52) U.S. Cl. .................. 257/310; 257/298
(58) Field of Classification Search ............. 257/310, 257/298, 300, 20, 24
See application file for complete search history.

(56) References Cited

U.S. PATENT DOCUMENTS

| 3,634,113 | A | | 1/1972 | Fehrenbacher | 106/55 |
| 4,626,517 | A | * | 12/1986 | Watanabe et al. | 501/96.1 |
| 6,528,858 | B1 | * | 3/2003 | Yu et al. | 257/493 |
| 6,693,321 | B1 | * | 2/2004 | Zheng et al. | 257/314 |

OTHER PUBLICATIONS

Published European Search Report Application No. 03447146.6-2102-, for Interuniversitaire Microelectronica Centrum vzw, dated Sep. 17, 2003.
Kukli K et al., *Comparison of hafnium oxide films grown by atomic layer deposition from iodide and chloride precursors*, Preparation and Characterization, Elsevier Sequoia, NL, vol. 416, No. 1-2, pp. 72-79, Sep. 2, 2002.
Gusev E.P. et al., *Ultrathin high-K metal oxides on silicon: processing, characterization and integration issues*, Microelectronic Engineering, Elsevier Publishers BV, Amsterdam, NL, vol. 59, No. 1-4, pp. 341-349, Nov. 2001.
Byoung Hun Lee, et al., *Thermal stability and electrical characteristics of ultrathin hafnium oxide gate dielectric reoxidized with rapid thermal annealing*, Applied Physics Letters, vol. 76, No. 14, pp. 1926-1928, Apr. 3, 2000.
Stefanic, et al., *The influence of thermal treatment on phase development in $ZrO_2$-$Fe_2O_3$ and $HfO_2$—$Fe_2O_3$ systems*, Journals of Alloys and Compounds, Elsevier Sequoia, Lausanne, CH, vol. 327, No. 1-2, pp. 151-160, Aug. 30, 2001.
Kadlec, et al., *High-temperature infrared reflectivity of yttria-stabilized hafnia single crystals*, Materials Science and Engineering B, Elsevier Sequoia, Lausanne, CH, vol. 72, No. 1, pp. 56-58, Mar. 2000.

* cited by examiner

*Primary Examiner*—David Nelms
*Assistant Examiner*—Thinh T Nguyen
(74) *Attorney, Agent, or Firm*—McDonnell Boehnen Hulbert & Berghoff LLP

(57) ABSTRACT

Dielectric material compositions comprising $HfO_2$ and a second compound are disclosed. The compositions are characterized by at least a part of the compositions being in a cubic crystallographic phase. Further, semiconductor based devices comprising such dielectric material compound and method for forming such compounds are disclosed.

11 Claims, 11 Drawing Sheets

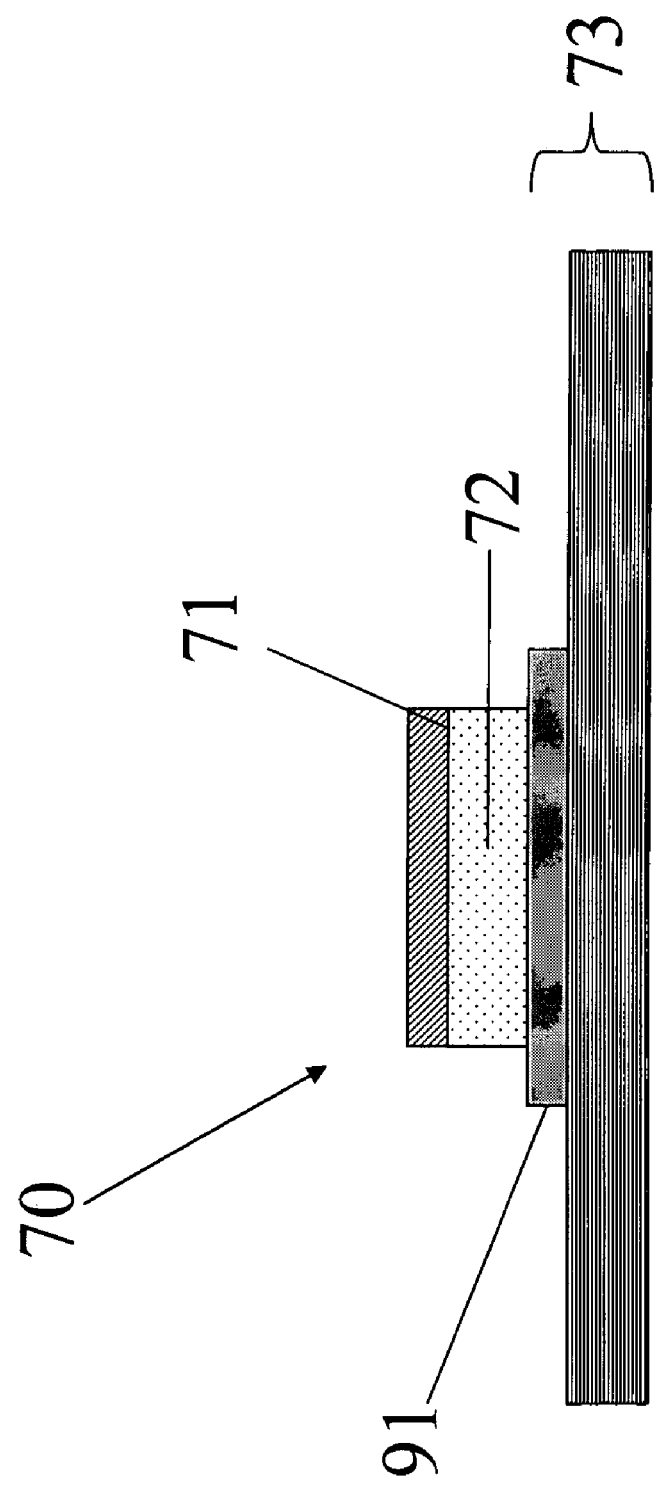

HIGH DIELECTRIC CONSTANT DEVICE

CROSS REFERENCE TO RELATED APPLICATIONS

This application claims priority benefits under 35 U.S.C. § 119(e) to U.S. Provisional Patent Application No. 60/387,487, filed on Jun. 10, 2002. The entire disclosure of U.S. Provisional Application No. 60/387,487 is hereby incorporated by reference.

FIELD OF INVENTION

The present invention relates to dielectric materials and, more particularly to high dielectric constant (high-k) materials.

BACKGROUND

Dielectric materials are widely used in semiconductor processing. One of the most commonly used dielectric materials is $SiO_2$ due to its exceptional physical and electrical properties. Further, $SiO_2$ is efficient to use as it may be directly formed on a silicon wafer in an oxidizing ambient. However, as semiconductor processes continue to advance and device geometries are further reduced, $SiO_2$ may no longer be an adequate dielectric material. In this regard, $SiO_2$ has a dielectric constant of 3.9, which is too low to meet the electrical requirements of advanced semiconductor manufacturing processes. For example, gate leakages for $SiO_2$ are prohibitive to its use in advanced, high-speed semiconductor logic and memory processes.

Given the above, alternative metal oxide based dielectric materials are currently being evaluated as $SiO_2$ replacements. Such dielectric materials have relatively high dielectric constants (k-values) in the range of approximately 10 and higher, and may contain elements such as yttrium (Y), lanthanum (La), zirconium (Zr), and hafnium (Hf), among others. Such dielectrics materials typically take the form of oxides of one more such elements, for example, and may be termed high-k dielectrics.

Dielectrics containing such elements, however, must be deposited on a semiconductor wafer, rather than being formed directly on a silicon substrate, as with $SiO_2$. Thus, the final electrical properties of a dielectric layer or stack of dielectric layers comprising such materials depends on a number of factors, such as the particular material or materials chosen to form the dielectric layer(s), the method of deposition, the sequence of deposition if mixed oxides are deposited, the preparation of the Si surface prior to deposition, any thermal treatment that is performed after deposition, among other considerations.

Based on the foregoing, high-k dielectric compositions that can be deposited on semiconductor substrates that are further processed, where the dielectric layers exhibit electrical and physical properties comparable or superior to $SiO_2$ is desirable. Such materials would provide considerable benefits to the semiconductor industry through their use. For example, one of the major advantages of such materials would be a reduction in gate leakage, as the higher k values would allow the use of physically thicker layers without resulting in any significant loss of gate capacitance, thereby reducing gate leakage. Such high-k dielectric materials may be used as gate dielectrics to manufacture transistors for future CMOS high-speed logic circuits and/or to manufacture capacitors for certain memory device applications. Thus, such high-k dielectrics would significantly facilitate the scaling of semiconductor based electronic devices in future logic and memory technologies.

BRIEF DESCRIPTION OF THE DRAWINGS

FIG. 9 is a cross-sectional view illustrating an electronic device in accordance with another embodiment of the invention.

SUMMARY

Figure 1B:
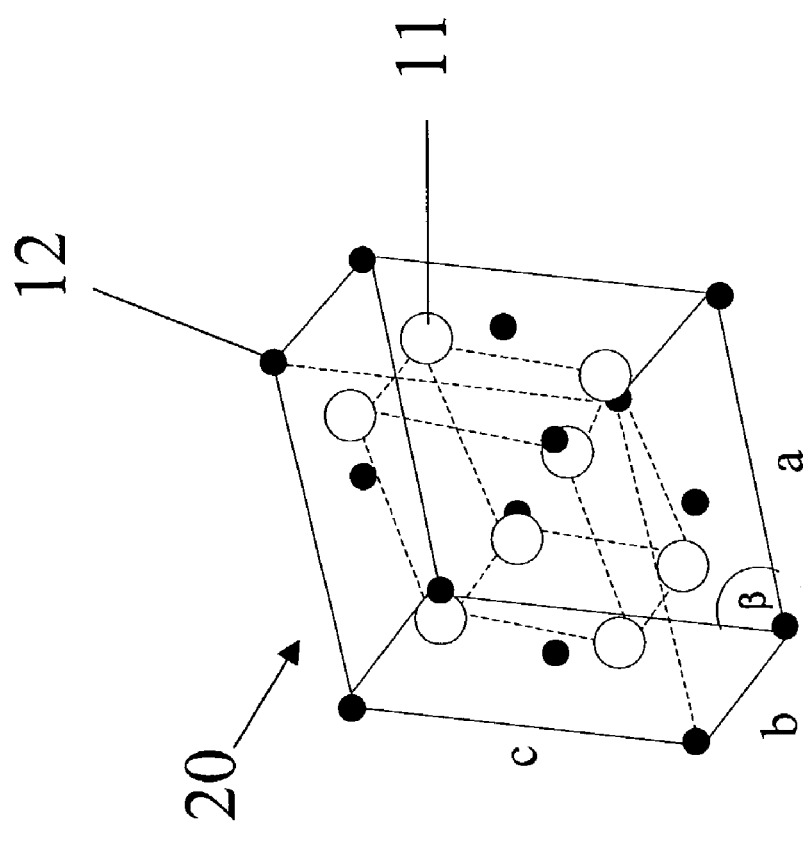
FIGS. 1a–1c are schematic drawings illustrating, in FIG. 1a, a cubic crystallographic structure of pure $HfO_2$, in FIG. 1b, a monoclinic crystallographic structure of pure $HfO_2$ and, in FIG. 1c a composition comprising $HfO_2$ and a second compound in accordance with an embodiment of the invention.

A dielectric composition in accordance with an embodiment of the invention comprises hafnium oxide ($HfO_2$) and a second compound. The composition is characterized by the fact that at least a part of the composition is in a cubic crystallographic phase. In one embodiment, the cubic crystallographic phase is stable at temperatures below 2800 degrees C., and preferably below 1200 degrees C.

In certain embodiments, the dielectric constant of the dielectric composition may be higher than the dielectric constant of pure $HfO_2$, higher than 20, or higher than 28. In these embodiments, the second compound may comprise a metal-oxide or, as one alternative, may comprise a metal-oxynitride. The metal of the metal oxide, or the metal oxynitride may be a trivalent metal. For example, in a particular embodiment, the second compound is $Al_2O_3$.

In one embodiment, a dielectric composition may be such that the second compound comprises between 1 [mol]% and 90 [mol]% of the composition. In another embodiment, the amount of the second compound included in the composition is between 1 [mol]% and 50 [mol]%. In yet another embodiment, the amount of the second compound included in the composition is below 4 [mol]%.

Dielectric compositions in accordance with embodiments of the invention may be used as dielectric materials for use in semiconductor fabrication processes. For example, such compositions may be used for gate dielectrics and/or for capacitor dielectrics. In a particular embodiment, an interfacial layer may be used between such dielectric compositions and, for example, a channel region of a transistor. Such an interfacial layer may comprise $SiO_2$ or SiOH.

An embodiment of a method for forming such dielectric compositions comprises placing a substrate in a reaction chamber, depositing a dielectric layer comprising a composition including $HfO_2$ and a second compound, and subjecting the deposited dielectric layer to a temperature which is higher than a crystallization temperature of the composition, such as, for example, a temperature that is between 400° C. and 1050° C. When subjected to such temperatures, the composition is transformed from an amorphous phase to a cubic crystallographic phase. In certain embodiments, depositing the dielectric layer is done by atomic layer deposition, where an interfacial layer is used.

DETAILED DESCRIPTION

As was discussed above, materials with relatively high dielectric constants (high-k dielectrics) are desirable for use in advanced semiconductor manufacturing processes to replace currently used lower dielectric constant materials, such as $SiO_2$. It is also desirable that the physical and electrical properties of such high-k dielectrics be relatively insensitive to other factors, such as subsequent thermal processing after application of the dielectric material. As was also mentioned above, hafnium oxide is one possible alternate for use as a dielectric material. However, pure hafnium oxide has certain drawbacks, which are discussed below.

Figure 1A:
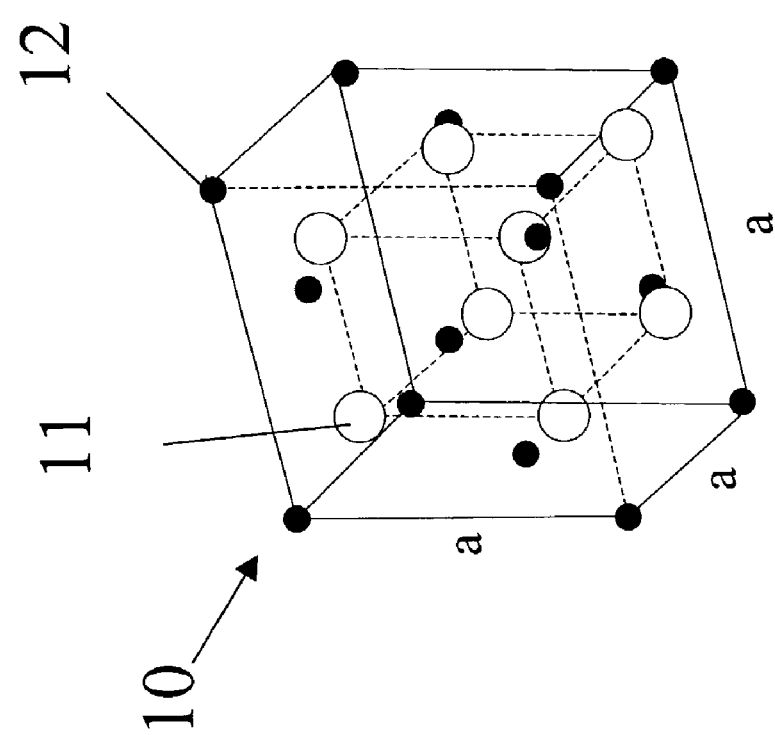

Referring now to FIG. 1, a schematic drawing of a section of a cubic crystallographic $HfO_2$ layer 10 is shown in FIG. 1a. Hafnium atoms are designated 12, while oxygen atoms are designated 11 in FIG. 1a. This form of substantially pure $HfO_2$, while theoretically possessing a high dielectric constant is not thermodynamically stable below temperatures of approximately 2800° C. Therefore, pure $HfO_2$ is impracticable for use in semiconductor devices as the melting point of silicon is 1200° C. and is even impracticable for detailed empirical studies.

Referring now to a FIG. 1b, a section of a thermodynamically stable (up to approximately 1900° C.) form of crystalline $HfO_2$ 20 that adopts a distorted fluorite ($CaF_2$) like structure is shown. This form of $HfO_2$ is termed monoclinic $HfO_2$. Such monoclinic $HfO_2$ possesses a dielectric constant (k-value) between 18–20. In FIG. 1b, as in FIG. 1a hafnium atoms are designated 12, while oxygen atoms are designated 11. The monoclinic form of $HfO_2$, however, has a lower dielectric constant than that of the cubic phase of $HfO_2$. Therefore, a cubic phase form of $HfO_2$ that is stable in the range of temperatures appropriate for semiconductor processing is desirable.

Figure 1C:
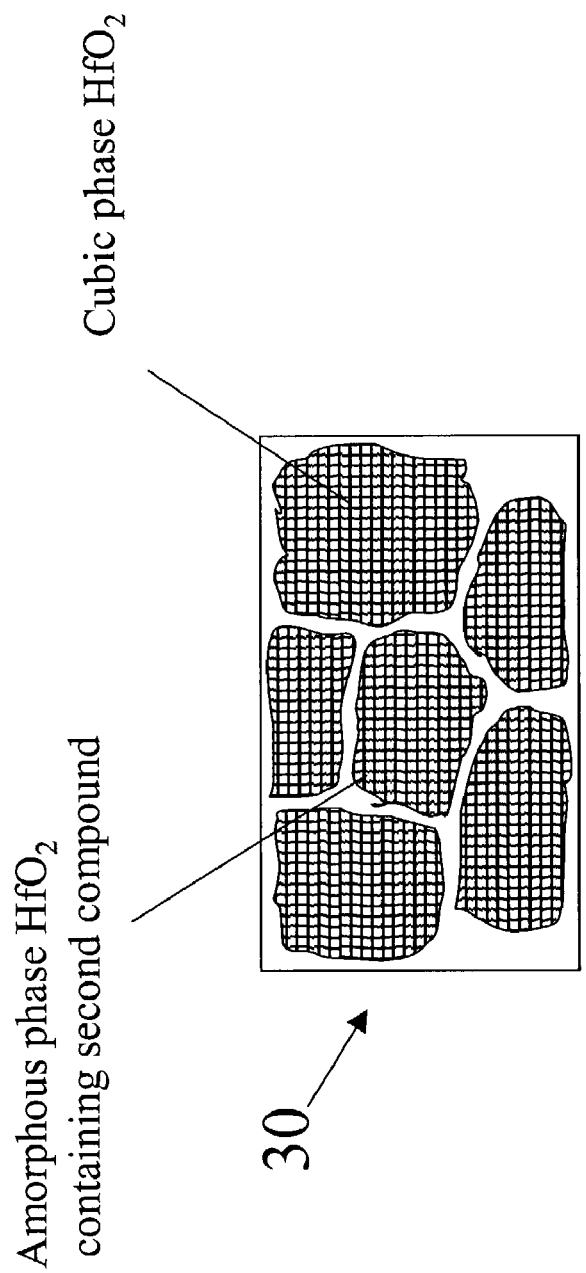

Now with reference to FIG. 1c, a schematic diagram of a section of a dielectric material 30 in accordance with the invention is shown. The dielectric material 30 is a composition comprising hafnium oxide ($HfO_2$) and a second compound. As may be seen in FIG. 1c, the composition 30 comprises portions that include cubic crystallographic $HfO_2$ and portions that include amorphous $HfO_2$ along with a second compound. The dielectric material 30 has been shown to be thermodynamically stable up to temperatures of 1200° C., making it practical for used in semiconductor manufacturing. It has also been shown that the dielectric material 30 has a significantly higher dielectric constant than the known thermodynamically stable phases of either $HfO_2$ (monoclinic or amorphous) or the second compound (examples of which are discussed below) individually in their pure forms.

To form the dielectric material 30, at least two compounds ($HfO_2$ and a second compound) are mixed to produce the dielectric material 30. In this context, mixing means that a homogeneous mixture of the two compounds (e.g. cubic phase $HfO_2$ and a second compound) is formed, resulting in the dielectric material 30, which contains the cubic crystallographic phase of $HfO_2$ in at least portions of the dielectric material 30, as is shown in FIG. 3c. In this regard, the dielectric material 30 comprises the individual elements of each of the two compounds in a chemically bonded state. Thus, the dielectric material 30 comprises a mixture of $HfO_2$ and the second compound, either in phase-separated form or in a chemical compound, characterized in that, at least portions of the dielectric material 30 are in the cubic crystallographic phase.

In this regard, a thermodynamically stable form of the cubic crystallographic phase of $HfO_2$ is obtained by mixing $HfO_2$ and the second compound on the atomic scale. As is known, a tetragonal crystallographic phase of $HfO_2$ is stable between 1800° and 2700° C., and the monoclinic crystallographic phase of $HfO_2$ is stable below 1800° C., while the pure form of cubic phase $HfO_2$ is not stable below 2800° C. In contrast, the dielectric material 30 is stable at temperatures below the melting point of Si (approximately 1200° C.). In that regard, the dielectric material 30 is stable below temperatures of 900 degrees C., 1000 degrees C., 1050 degrees C., 1100 degrees C. or 1200 degrees C. In the preferred embodiment, the composition is stable at temperatures below 1200 degrees C.

As previously described, the dielectric material 30 comprises $HfO_2$ and a second compound. The second compound can be a metal oxide or a metal oxynitride. The second compound is selected for its interaction with $HfO_2$, such that it stabilizes the formation of $HfO_2$ in the cubic crystallographic phase in the desired process temperature range. This interaction (resulting in the formation of cubic phase $HfO_2$) enables higher dielectric constants to be achieved, as compared to pure (monoclinic) $HfO_2$.

The second compound may be selected from the group consisting of aluminum (Al), silicon (Si), yttrium (Y), cerium (Ce), magnesium (Mg), calcium (Ca), transition metals, oxides thereof and oxynitrides thereof. Transition metals can be titanium (Ti), tantalum (Ta), lanthanum (La) and the like. In a particular embodiment, said second compound is a metal oxide. Said metal can be a trivalent metal such as aluminum (Al), lanthanum (La) or scandium (Sc). In a particular embodiment, the second compound may be $Al_2O_3$, $SiO_2$, $Y_2O_3$, $CeO_2$, $MgO_2$, CaO, $TaO_2$, $La_2O_3$ or, alternatively $TiO_2$. The dielectric constant of such compositions are higher than the dielectric constant of pure (monoclinic) $HfO_2$. For example, in certain embodiments the dielectric constant of the dielectric material 20 is higher than 20, higher than 22, higher than 25, or higher than 28.

The amount of the second compound in the dielectric material 20 may be 90 [mol]%, 80 [mol]%, 70 [mol]%, 60 [mol]%, 50 [mol]%, 40 [mol]%, 30 [mol]%. The amount of the second compound may be between 1 to 50 [mol]%, between 5 and 40 [mol]% and in certain embodiments between 9 [mol]% and 24 [mol]%. The amount of the second compound should be chosen such that at least a portion of the new composition is stable in the cubic crystallographic phase in the desired temperature range and that the dielectric value of the dielectric material 20 is higher than the dielectric value of pure $HfO_2$.

In certain embodiments, the dielectric material 20 may comprise a composition with a lower amount of metal oxide. In this context, a lower amount should be understood to be an amount below 30 [mol]%. This is of particular importance for the controlling the electrical properties of the dielectric material 20 in semiconductor applications and, in particular, transistor gate dielectric applications. In this respect, the control of threshold voltages for transistors comprising the dielectric material 20 in a gate stack may be facilitated by the use of such a composition with a lower amount of metal oxide.

For purposes of illustration, the remainder of this disclosure discusses dielectric materials that comprise $HfO_2$ and $Al_2O_3$. It will be appreciated that this composition is exemplary. It will also be appreciated that such compositions may vary and may include, for example, compounds such as those described above. Thus the invention is not limited scope to the use of $HfO_2/Al_2O_3$ compounds, and other compounds in accordance with embodiments of the invention exist.

In a specific embodiments of dielectric materials comprising an $HfO_2/Al_2O_3$ composition, the dielectric materials are thermally stable up to at least 1050° C., as a result of mixing $Al_2O_3$ and $HfO_2$. As previously indicated, such materials may be said to in a cubic crystallographic phase. The cubic crystallographic phase is observed to form in compositions having a concentration of $Al_2O_3$ in the range from 1 to 30 [mol]%.

In certain of these embodiments, the concentration is from 9 to 24 [mol]% $Al_2O_3$. This range is, of course, exemplary, and the cubic crystallographic phase will also form outside the concentration ranges provided herein. In particular, the admixing of smaller amounts of $Al_2O_3$ is of particular interest. In this regard, including a lower $Al_2O_3$ content will allow adjustment of the electrical properties of the mixed oxide, which is particularly important for applications in the semiconductor industry. More specifically, such adjustment may allow for the control of the transistor threshold voltages, as indicated above. (Where a threshold voltage is the voltage at which a transistor can be turned on and/or off.) Such a result is due, at least in part, to the fact that the negative fixed charge due to the $Al_2O_3$ in the film would be reduced.

In an embodiment comprising a lower $Al_2O_3$ concentration, the dielectric constant of the resulting cubic phase $HfO_2$ was measured to be at least 29.8, a value significantly higher than the measured dielectric constant of approximately 18–20 of the thermodynamically stable orthorhombic or monoclinic phase of pure $HfO_2$. This attribute of such mixed dielectric materials allows the use of a physically thicker layer, as compared to the thermodynamically stable phase of pure monoclinic $HfO_2$ without observing any substantial loss of gate capacitance. In turn, the use of such a thicker dielectric layer reduces gate leakage currents and, effectively, widens the processing window (upper and lower limits) for film deposition.

Further, because the cubic crystallographic phase of such dielectric materials is stable at least up to 900° C., or at least up to 1050° C., a wide portion of the temperature range typically used during semiconductor processing is covered. Therefore, the physical and electrical properties of such dielectric materials would not be substantially affected by subsequent processing operations. Additionally, the dielectric material 20, shown in FIG. 1, can also be used for alternate semiconductor device fabrication processes such as a gate last process flow or replacement gate flow for transistor fabrication. Still furthermore, the dielectric material 20 may be used to form memory storage capacitors and/or integrated passives device for applications in memory and/or mixed-signal devices.

Exemplary $HfO_2$—$Al_2O_3$ Composition

For the purpose of the following discussion, high-k dielectric means a dielectric material having a dielectric value higher than the dielectric value of $SiO_2$ (which is 3.9). Also for purposes of the following discussion, the term mixed oxide refers to compositions comprising hafnium oxide ($HfO_2$) and a metal oxide, in particular $Al_2O_3$.

Film Deposition

To obtain homogeneous mixing of the two oxides ($Al_2O_3$ and $HfO_2$)—with accurate process control, a preferred method is to use atomic layer deposition (ALD). This technique allows the deposition of one or more oxides with good control of the amount of deposited material as ALD takes advantage of surface saturated reactions and, thus, can be controlled on a sub monolayer scale by alternating the chemicals used in the deposition process in a pulsed reactor. For example, using one deposition cycle each of trimethyl aluminum (TMA or $Al(CH_3)_3$) and $H_2O$ in sequence will yield a sub-monolayer of deposited $Al_2O_3$. Similarly, the use of one cycle each of hafnium tetrachloride ($HfCl_4$) and $H_2O$ will result in the deposition of a sub-monolayer of $HfO_2$. Thicker layers of each oxide can be deposited by repeating these deposition cycle sequences. By alternating gases used during the deposition process in the proper manner, mixtures of $HfO_2$ and $Al_2O_3$ can be produced with widely varying composition, such as the composition combinations discussed above. In the following discussion, the deposition methods (cycles) are described by the following nomenclature:

$x\ cy(HO:AO(y:z))$, or $x*(y\ cy\ HO:z\ cy\ AO)$, where 'cy' stands for 'cycle', 'HO' stands for 'hafnium oxide' and 'AO' stands for 'aluminum oxide'. The parameter 'y' is the number of HO deposition cycles applied in sequence each comprising a cycle of $HfCl_4$ and $H_2O$. Likewise, the parameter 'z' is the number of AO deposition cycles applied in sequence each comprising a cycle of TMA and $H_2O$ and following the y cycles of HO deposition. This whole sequence (HO:AO (y:z)) is then repeated 'x' number of times until the desired thickness is reached. If the deposition is started with an AO cycle, the nomenclature (AO:HO (y:z)) is used to indicate the correct cycle order.

It is to be understood that such mixed oxides (dielectrics) can also be formed by the use of suitable chemical precursors that are different from those used in the embodiments described herein. It is also to be understood that such mixed oxides can be fabricated by any number of other known methods such as chemical vapor deposition (CVD), plasma enhanced chemical vapor deposition (PECVD), physical vapor deposition (PVD) of metals followed by oxidation or PVD in an oxidizing ambient, and any number of variations of these approaches.

Referring again to deposition using ALD, to obtain a homogeneous deposition using this technique, an OH terminated Si surface is used instead of using a H-terminated Si surface, especially for films with a thickness of less than 5 nm. It is noted that the exemplary depositions dicussed herein were performed on Si substrates covered with a thin interfacial $SiO_2$ layer (providing a fully or partially OH terminated surface) with a thickness of less than 1.5 nm. Two types of interfacial oxides have been used for the embodiments discussed herein. One interfacial oxide type is a chemical oxide obtained by an $O_3$-based clean. The other interfacial oxide type is a thermally grown oxide using a rapid thermal oxidation (RTO) process at 650° C. It will be understood that chemical oxides and thermal oxides can be obtained by numerous other methods and/or processing conditions and that interfacial layers produced by such variations can provide similar advantages for the deposition of high-k layers as the techniques described herein. While OH terminated surfaces are described in this disclosure, it will be appreciated that mixtures of $HfO_2$ and $Al_2O_3$ could also be deposited on any number of other surfaces such as H-terminated Si, metals, among others.

Table 1, which is presented below, summarizes some exemplary layers deposited by the method described above using atomic layer deposition (ALD). For these layers, a chemical oxide was used as a starting surface for deposition.

spectra have been recorded for as-deposited films (without an anneal) and for films that have undergone a post deposition anneal (PDA) at 700° C., 800° C. and 900° C. for 1 minute.

Figure 2B:
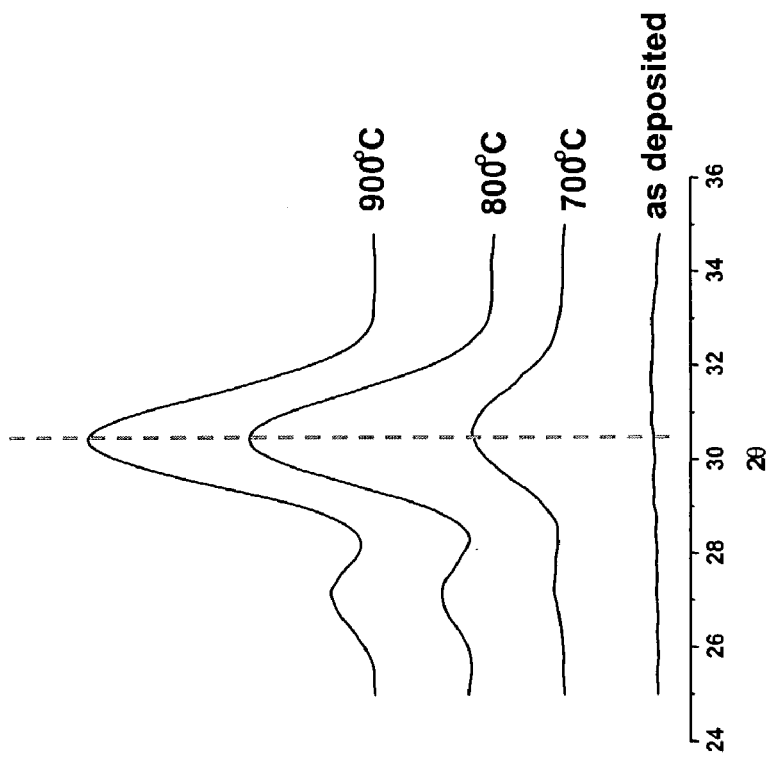
FIGS. 2a–2b are graphs illustrating x-ray diffraction spectra (for films as deposited and after annealing) for, in FIG. 2a, a pure $HfO_2$ film, and in FIG. 2b, a mixed oxide $HfO_2/Al_2O_3$ film.
Figure 2A:
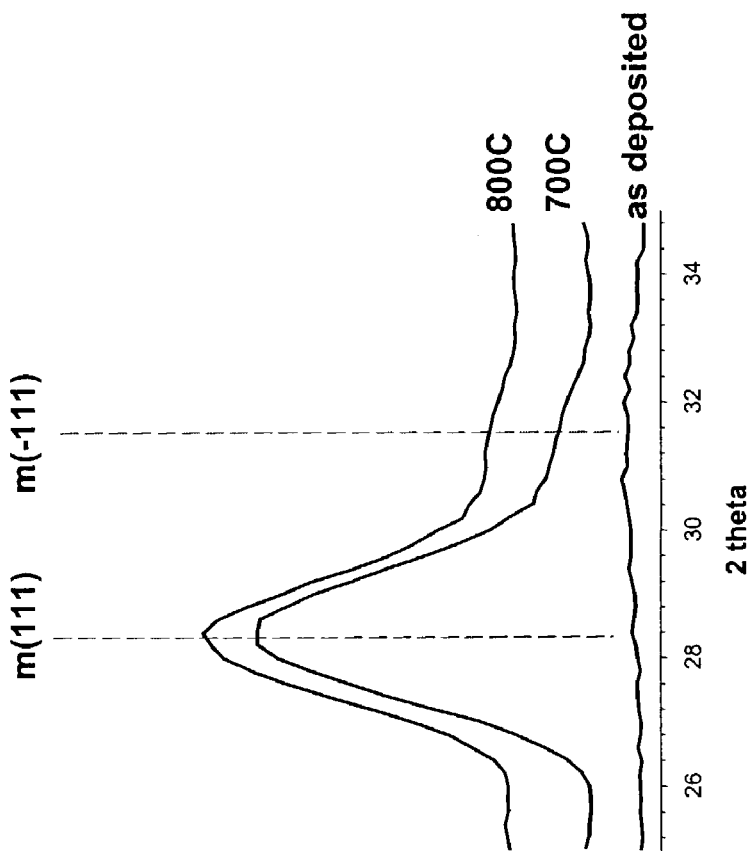

The approximate layer thickness as measured by spectroscopic ellipsometry was 4.9–5.3 nm for pure $HfO_2$ and 5.0–5.5 nm for the (9:1) mixed Hf:Al oxide. In both cases, the as-deposited films exhibit an X-ray pattern typical for an amorphous layer. Both layers show signs of crystallization after anneals at temperatures higher than 700° C. (anneal temperatures of 700° C., 800° C. and 900° C. were tested, as indicated in FIGS. 2a and 2b). Pure $HfO_2$ is observed to crystallize into the monoclinic phase, with dominant reflection peaks as indicated in FIG. 2a. The film containing aluminum crystallizes into the cubic phase with dominant reflection peaks as indicated in FIG. 2b. The cubic phase was observed at all three anneal temperatures.

Figure 3B:
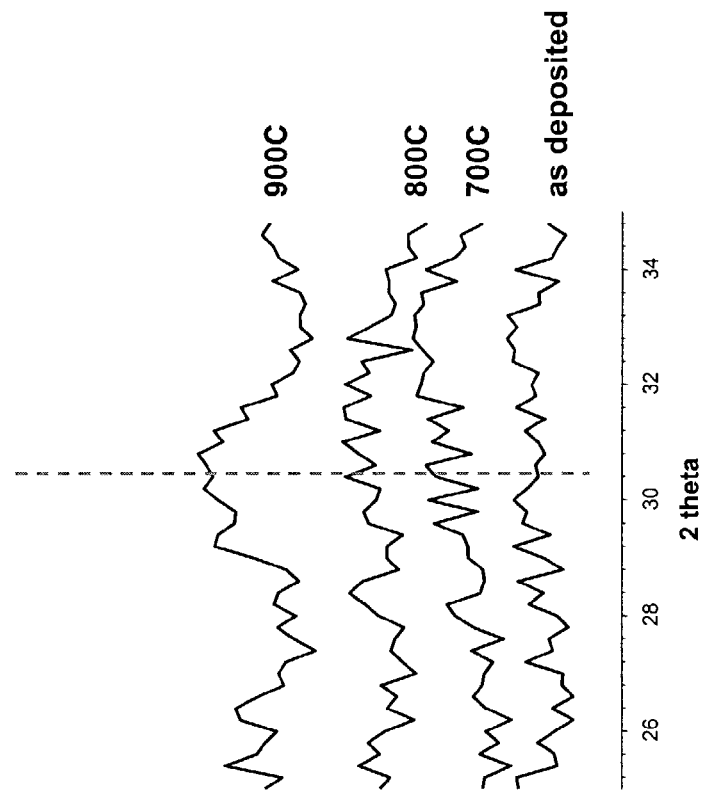
FIGS. 3a–d are graphs illustrating an X-ray diffraction spectra (for films as deposited and after annealing) for, in FIG. 3a, a first mixed oxide $HfO_2/Al_2O_3$ film, in FIG. 3b, another mixed oxide $HfO_2/Al_2O_3$ film and, in FIGS. 3c–d, respective experimental and simulated X-ray diffraction spectra for two mixed oxide $HfO_2/Al_2O_3$ films.
Figure 3A:
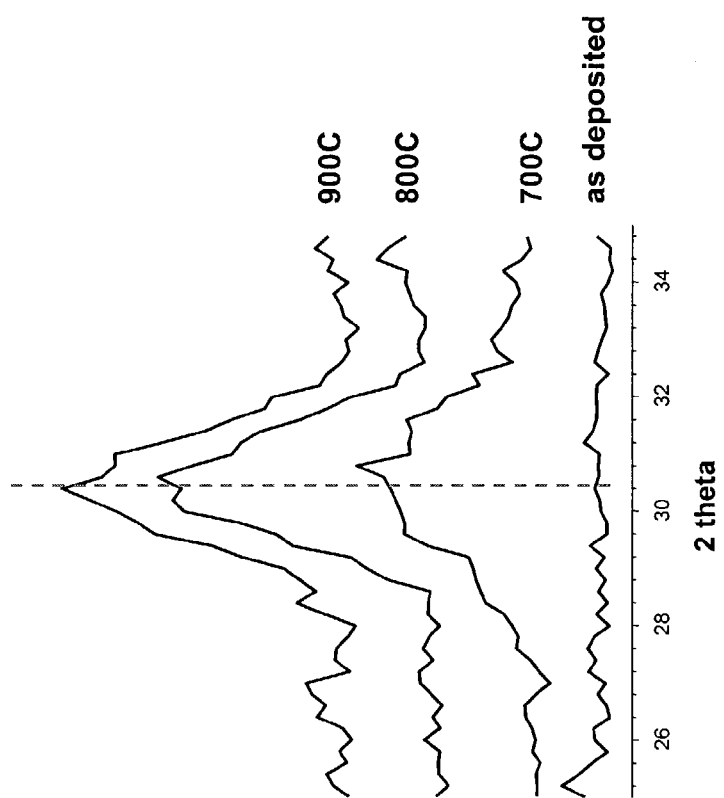
Figure 3C:
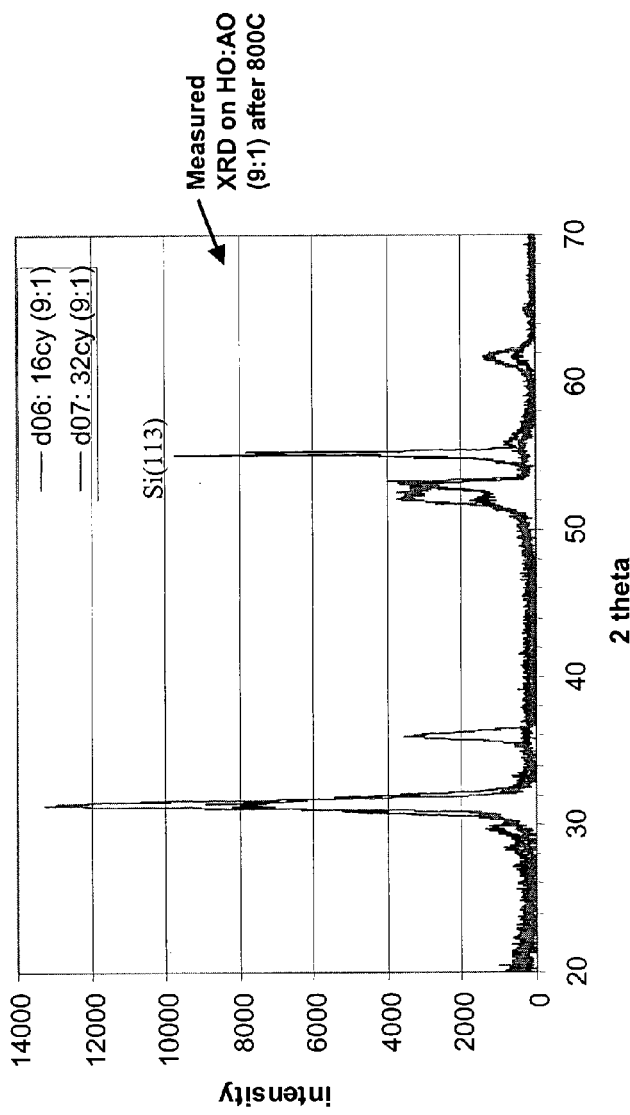

FIG. 3 is a graph illustrating XRD spectra of mixed Hf:Al oxide layers deposited with a ratio of (HO:AO (4:1)) (FIG. 3a) and (HO:AO (2:1)) (FIG. 3b). XRD spectra have been recorded for as-deposited films (with no anneal) and for films undergoing a post deposition anneal at 700° C., 800° C. and 900° C. for 1 minute.

TABLE 1

| Sample # | Deposition cycle ratio HO:AO | Deposition cycle | Composition | Crystalline morphology |
| --- | --- | --- | --- | --- |
| 1 | 1:0 | 80 cy HO | $HfO_2$ | monoclinic |
| 2 | 1:0 | 160 cy HO | $HfO_2$ | monoclinic |
| 3 | 1:0 | 320 cy HO | $HfO_2$ | monoclinic |
| 4 | 9:1 | 8 * (9 cy HO: 1 cy AO) | $Hf_5AlO_x$ | cubic |
| 5 | 9:1 | 16 * (9 cy HO: 1 cy AO) | $Hf_5AlO_x$ | cubic |
| 6 | 9:1 | 32 * (9 cy HO:1 cy AO) | $Hf_5AlO_x$ | cubic |
| 7 | 18:2 | 4 *(18 cy HO:2 cy AO) | $Hf_5AlO_x$ | cubic |
| 8 | 18:2 | 8 *(18 cy HO:2 cy AO) | $Hf_5AlO_x$ | cubic |
| 9 | 27:3 | 3 *(27 cy HO:3 cy AO) | $Hf_5AlO_x$ | cubic |
| 9 | 27:3 | 6 *(27 cy HO:3 cy AO) | $Hf_5AlO_x$ | cubic |
| 10 | 4:1 | 16 * (4 cy HO:1 cy AO) | $Hf_5AlO_x$ | cubic |
| 11 | 2:1 | 25 * (2 cy HO:1 cy AO) | $Hf_5AlO_x$ | cubic |

Compositional/structural analysis of dielectric layers comprising $HfO_2$ and $Al_2O_3$ Samples #1 to #3 of Table 1 are pure HO depositions yielding the chemical composition $HfO_2$. After crystallization, only the thermodynamically stable monoclinic crystallographic phase of $HfO_2$ is observed. Samples #4 to #8 of Table are mixed oxides obtained by the mixing method described above, resulting in mixtures with the listed chemical composition. In all these mixtures, the primary crystallographic phase is found to be of cubic structure. The compositions of the ALCVD deposited $HfO_2$ and $HfO_2$—$Al_2O_3$ alloy layers were determined using x-ray fluorescence (XRF). The structure of the as-deposited layers, and of the layers after post-deposition anneals were determined using grazing incidence X-ray diffraction. To study the crystallization progression/behavior, annealing was performed in $N_2$ at different temperatures for 1 min.

Structural Analysis Using X-ray Diffraction

To analyze the structure of the thin layers deposited in this study, grazing incidence X-ray diffraction (XRD) was used. The morphologies of the as-deposited layers were found to exhibit an XRD pattern typically observed for amorphous layers. Examples of XRD spectra for various such compositions are shown in FIGS. 2 and 3. FIG. 2 summarizes and compares the crystallization behavior of pure $HfO_2$ (FIG. 2a) and of a mixed (HO:AO)(9:1) layer (FIG. 2b). XRD The approximate layer thickness as measured by spectroscopic ellipsometry was 5.0–5.6 nm for the (4:1) composition and 5.2–5.6 nm for the (2:1) composition. Before annealing, the layers are found to exhibit X-ray spectra typical for amorphous layers. After annealing, the cubic $HfO_2$ phase can be observed in both layers. The crystallization temperature is observed to be higher for films with a higher aluminum concentration, as is shown by comparing FIG. 3b with FIG. 3a (the films represented in FIG. 3b having a higher aluminum concentration).

Figure 3D:
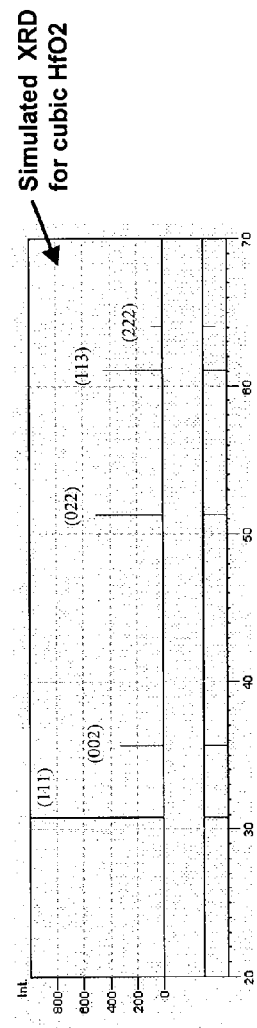

To characterize the cubic phase oxides more rigorously, XRD spectra were taken over a wider angular range and in thicker layers. FIGS. 3c and 3d are graphs that show two measured XRD spectra (FIG. 3c) as with corresponding simulated XRD spectrum (FIG. 3d) for a compound including the cubic $HfO_2$. As can be seen by comparison, the diffraction peak positions and intensities measured in the two thicker $Hf_5AlO_x$ layers agree well with the simulation for a cubic $HfO_2$ phase with a lattice parameter a=0.504 nm.

Structural Studies Using Fourier Transform Infrared Spectroscopy

Figure 4:
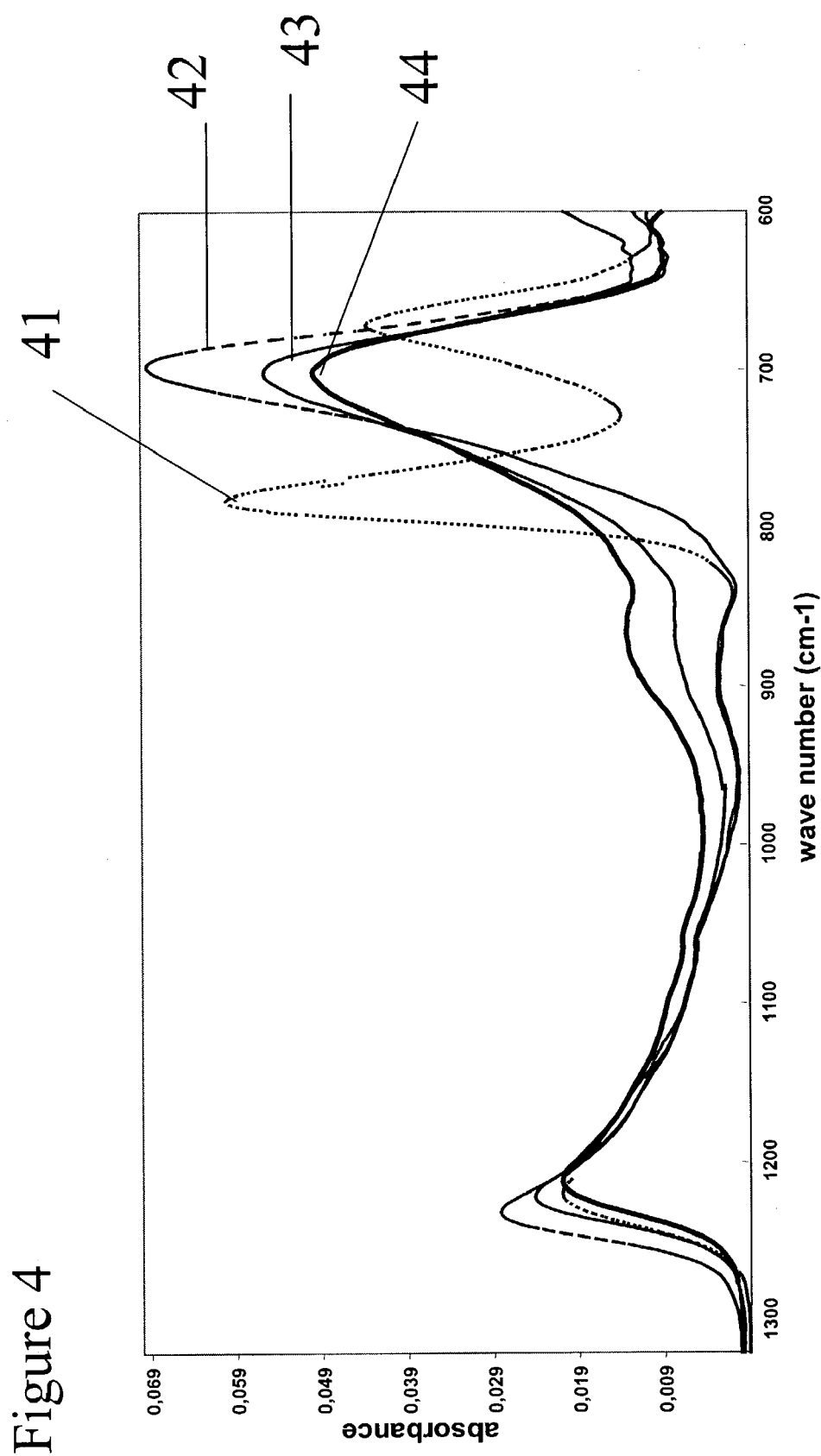
FIG. 4 is graph illustrating a Fourier transform infrared (FTIR) spectra of an $HfO_2$ layer and $HfO_2/Al_2O_3$ mixed oxides of various compositions annealed at 900° C. for 1 min in an $N_2$ atmosphere.

FIG. 4 is a graph showing Fourier transform infra-red (FTIR) spectra for (HO:AO) mixed oxide layers with deposition ratios of (9:1) (represented by trace 42), (4:1) (represented by trace 43) and (2:1) (represented by trace 44) and a layer of pure HfO$_2$ (represented by trace 41). The FTIR spectra are for films that were subjected to annealing at 900° C. The annealing was performed at a pressure of 40 Torr in an N$_2$ ambient for one minute. The FTIR spectra consist of two distinct regions. The vibrations in the range from wave numbers of 1300 to approximately 1100 correspond to vibrations in a SiO$_2$ layer used as a starting layer for HO and HO:AO deposition. For this particular case, a chemical oxide was used. The vibrations below approximately wave numbers of 1050 correspond to vibrations in the HfO$_2$ and/or (HO:AO) mixed oxide layers, and may be used to study their structure.

It may also be seen in FIG. 4, that the vibration spectra of the two types of materials is distinctly different. The spectrum of pure HfO$_2$ consists of two sharp vibration bands in the metal oxide spectral region at wave numbers of approximately 780 to 670. In contrast, the FTIR spectrum of the mixed oxides shows only a single vibration band near the wave number 700, which is expected for a crystal structure with high symmetry, such as the cubic crystallographic phase structure. It is noted that no significant spectral changes occur in the FTIR region of the interfacial oxide layer, indicating that it is stable during the applied heat (annealing) treatments.

Electrical Characterization of HfO$_2$—Al$_2$O$_3$ Layers

Figure 5:
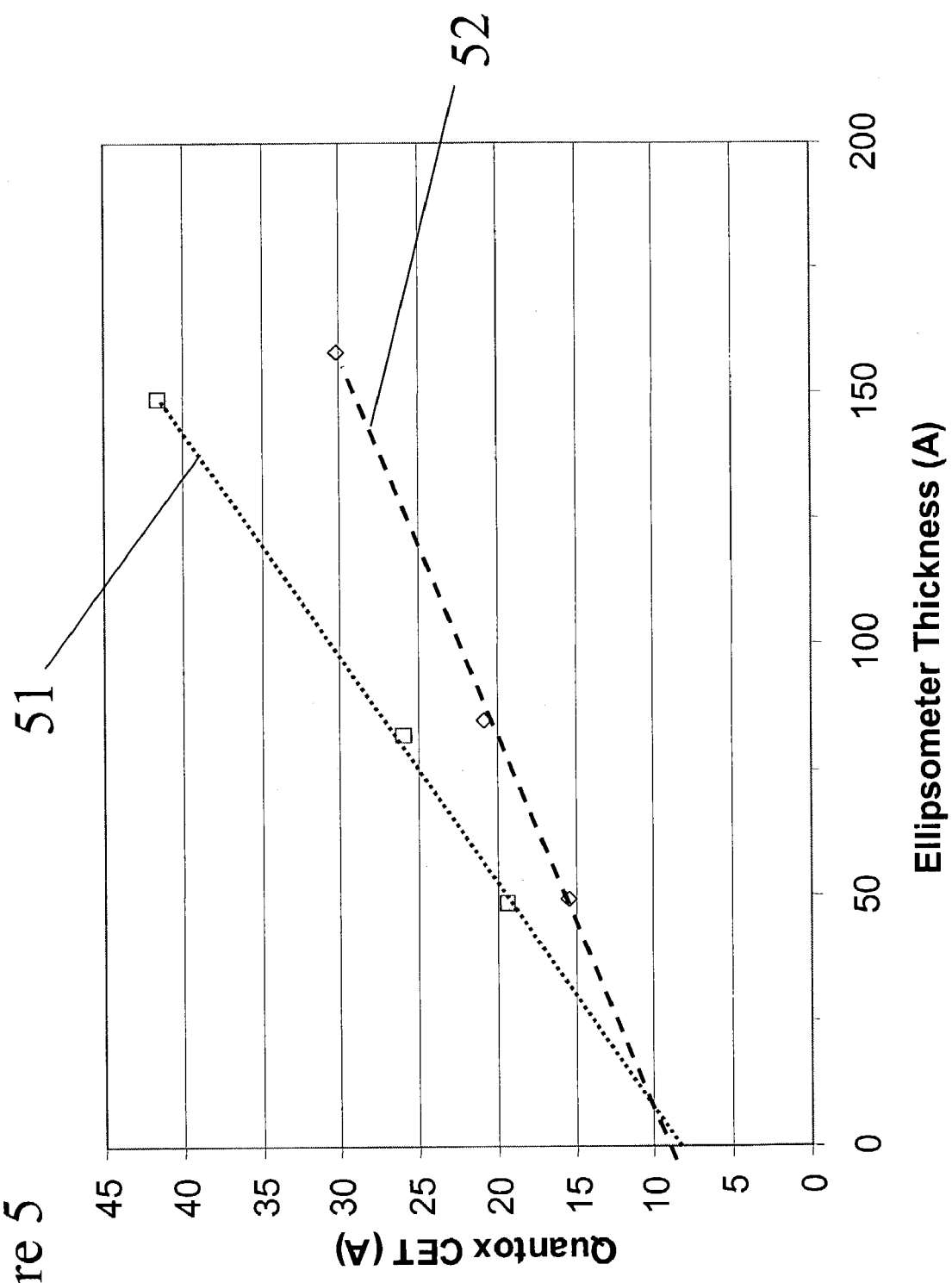
FIG. 5 is a graph illustrating capacitance equivalent thickness (CET) values versus ellipsometric layer thicknesses for pure $HfO_2$ layers and for layers comprising a mixed oxide.

FIG. 5 is a graph that illustrates the results of electrical measurements performed on the layers described with respect to FIG. 4. The dielectric constants of these layers were measured by the approach described below. As may be seen in FIG. 5, capacitance equivalent thickness (CET) values as measured by the Quantox™ Q-V method (of course, other methods can be used to measure the CET values) are plotted versus the ellipsometric layer thickness for pure HfO$_2$ layers represented by trace 51) and HO:AO (9:1) mixed oxide layers (represented by trace 52) of varying thickness. Both layers were annealed at 800° C. at a pressure of 40 Torr in an N$_2$ ambient for 1 min prior to the CET evaluation. The ellipsometric layer thickness is used as an approximate measure for the true physical thickness of the high-k dielectric layer. Since the layer consists of two dielectric materials, the interfacial oxide and the high-k film, CET can be expressed as follows, CET:=EOT:=$t_{SiO2}+k_{SiO2}/k_{hik} * t_{ell}$, where EOT stands for equivalent oxide thickness (an often used synonym for CET), $t_{SiO2}$ is the interfacial oxide layer thickness, $k_{SiO2}$ is the dielectric constant of silicon dioxide with a value of 3.9, $k_{hik}$ is the dielectric constant of the deposited high-k dielectric layer and $t_{ell}$ is the ellipsometric thickness of the high-k layer. From this equation, it may be seen that the dielectric constant of the high-k layer is inversely proportional to the slope of the data sets shown in FIG. 5, and the intercept with the CET axis provides a measure for the interfacial oxide thickness.

Interpreting the data in FIG. 5, a value of 18 is determined for the dielectric constant of pure HfO$_2$, while a higher value of 29.8 is determined for the (9:1) mixed oxide. The interfacial oxide layer thickness is found to be approximately 0.8–0.9 nm, which is in good agreement with the nominal thickness resulting from the growth of a chemical oxide using an O$_3$ based clean. This determination also confirms (with regard to the FTIR measurements) that the interfacial layer is not significantly modified during annealing.

As can be seen from data for the mixed oxide layer shown in FIG. 5, annealing (here at 800° C.) results in a reduction of the CET value as compared to that of the as-deposited film. For HfO$_2$ films, no k-value enhancement is observed.

Based on these findings, exemplary annealing temperatures for the (9:1) mixed oxide are may be in a range from just above the crystallization temperature of the (9:1) mixed oxide to approximately 800° C. However, annealing temperatures in the range from 400° C. to 1050° C. may be useful to transform the amorphous phase of HfO$_2$ to the cubic phase, which will occur at temperatures of approximately 400° C. or higher While, the ambient used for post deposition annealing used in this study was N$_2$ at a pressure of 40 Torr, it will be appreciate that the cubic phase may also be formed by annealing in other inert ambient gases frequently used for such anneals, such as helium (He), argon (Ar), or mixtures of these with N$_2$. Alternatively, an oxidizing ambient such as O$_2$, N$_2$O or NO may be used.

The use of such layers in semiconductor manufacturing may be facilitated more efficiently if the post deposition anneal is omitted, and the structural transformation of the layer to the desired crystalline cubic phase is accomplished simultaneously with one (or more) commonly used processing steps such as a Si gate (such as polysilicon) electrode deposition or an implant activation anneal.

Figure 6:
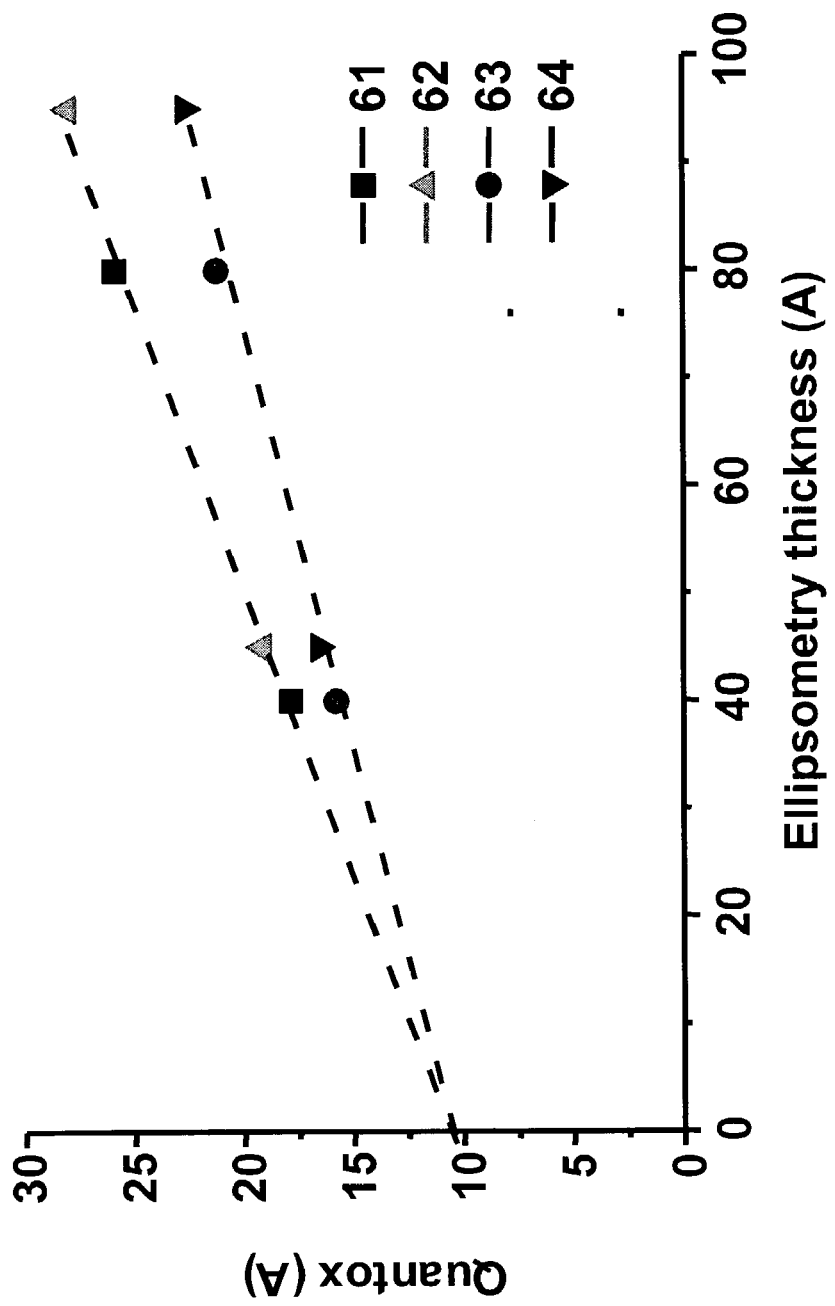
FIG. 6 is a graph illustrating capacitance equivalent thickness (CET) values versus ellipsometric layer thicknesses for layers comprising two different mixed oxides (designated (HO:AO)(18:2) and (HO:AO)(27:3)) before and after annealing.

FIG. 6 shows similar results to FIG. 5 obtained with a samples of HO:AO (18:2) and (27:3). Trace 61 represents the results for HO:AO (18:2) before anneal, while trace 62 represents the results for HO:AO (27:3) before anneal. Before annealing, the as-deposited layers, which have amorphous phases, have a k-value of approximately 20. Trace 63 represents the results for HO:AO (18:2) after anneal, while trace 64 represents the results for HO:AO (27:3) after anneal. After annealing, the films have dominantly cubic crystalline phase HfO$_2$ and have k-values around 29. This further demonstrates the relationship between high k-values and cubic phase HfO$_2$. In this regard, the k-value of the amorphous phase is slightly lower than that of the pure HfO$_2$ after annealing, as shown in FIG. 5. The intercept of the two curves with the y-axis corresponds to a CET value of that corresponds with and approximately 1.0 nm thick SiO2 layer, revealing that the annealing does not increase the thickness of the interfacial SiO$_2$ layer.

Exemplary Electronic Device

Figure 7:
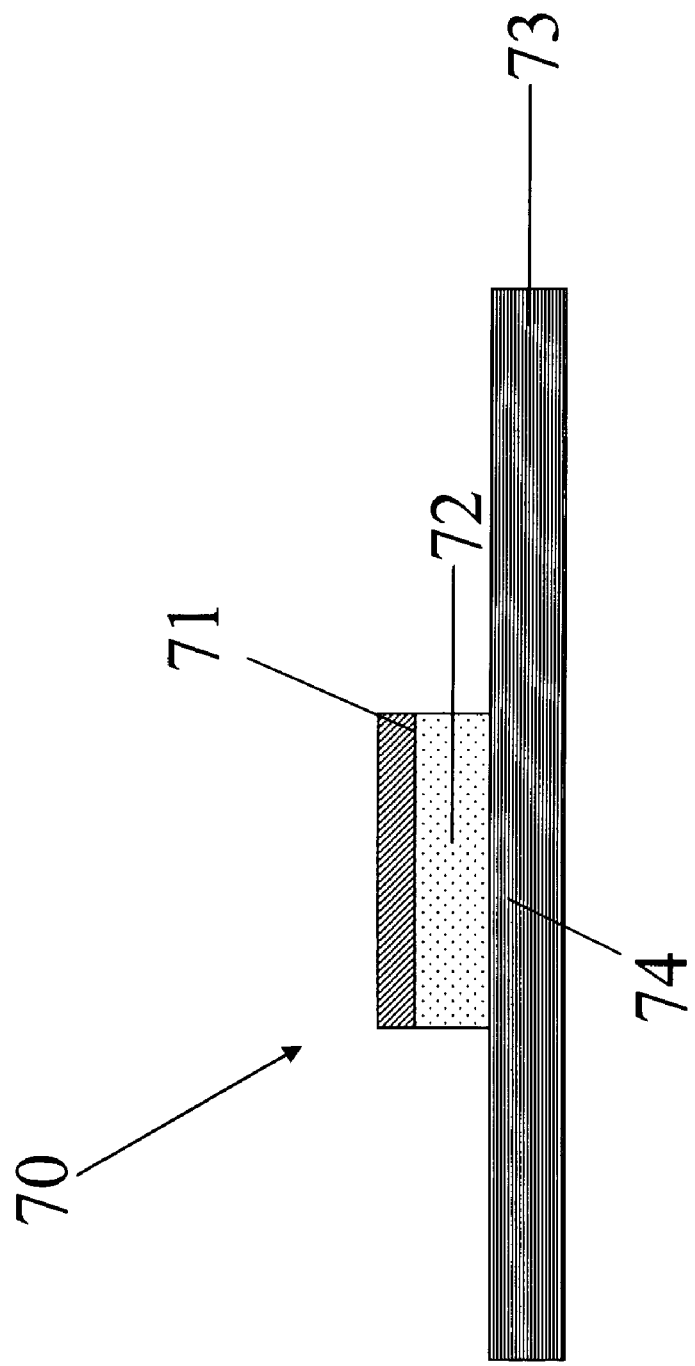
FIG. 7 is cross-sectional view illustrating an electronic device in accordance with an embodiment of the invention.

Referring now to FIG. 7, an exemplary embodiment of an electronic device 70 is show. The device 70 comprises a gate electrode 71, a substrate 73 having a top surface underlying the gate electrode and a dielectric layer 72 interposed between the gate electrode and the top surface. The dielectric layer 72 comprises a dielectric material including HfO$_2$ and a second compound where the composition has at least portions where the HfO$_2$ is in the cubic crystallographic phase, such as has been previously described.

For transistor applications, the substrate also comprises a channel region 74 underlying the dielectric layer 72. The device may further comprise a barrier layer (not shown), the barrier layer being interposed between the substrate 73 and the dielectric layer 72, for example. Further, for memory device applications, as shown in FIG. 9, the substrate 73 further comprises an electrode 91 underlying the dielectric layer 72.

The thickness of the dielectric layer 72 can be between 5 Å and 1000 Å, between 5 Å and 500 Å, between 5 Å and 100 Å. Furthermore, the dielectric layer 72 may have an equivalent oxide thickness (EOT) between 0.5 Å and 150 Å, between 0.5 Å and 75 Å, between 0.5 Å and 15 Å.

Method For Forming A Dielectric Material

Figure 8:
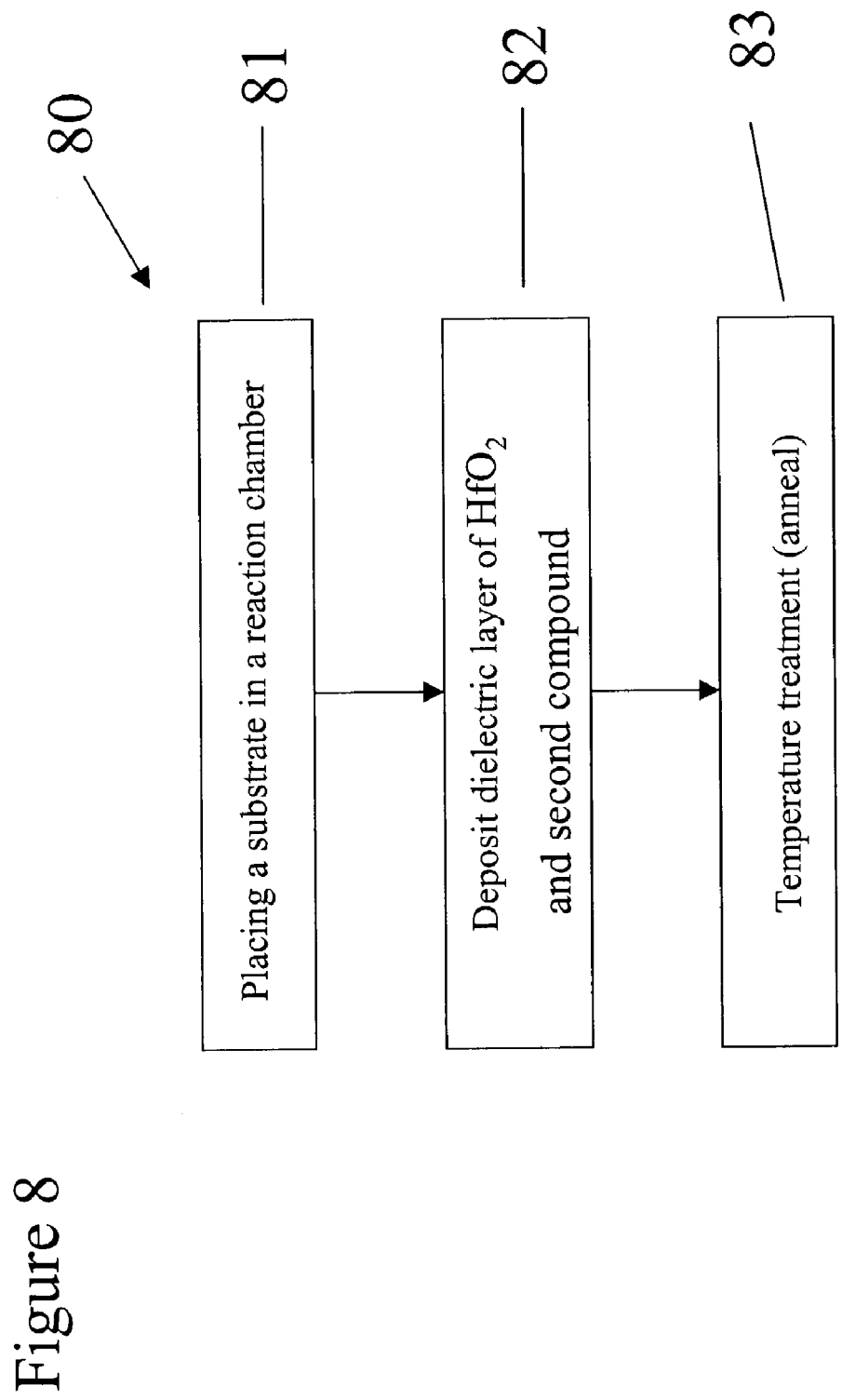
FIG. 8 is a flowchart illustrating a method for forming a device in accordance with an embodiment of the invention.

Referring now to FIG. 8, a flowchart illustrating a method 80 for forming a dielectric layer is shown. The method 80 comprises, at block 81, placing a substrate in a reaction chamber. At block 82, the method 80 further comprises depositing a layer of dielectric material, where the dielectric material comprises $HfO_2$ and a metal oxide. The deposition of the dielectric material may be accomplished by atomic layer deposition, atomic layer chemical vapor deposition, chemical vapor deposition, metal organic chemical vapor deposition, sputtering or sol-gel deposition. At block 83, the substrate is subjected to a temperature (annealed) that is higher than the crystallization temperature of the dielectric material, such that at least a portion of the composition is transformed to the cubic crystallographic phase during the anneal. The annealing temperature is preferably higher than 400 degrees C., as was discussed above.

In this regard, the annealing temperature may be in the range from 400° C. to 1050° C. and performed in an atmosphere in an ambient comprising at least one compound selected from the group consisting of $N_2$, He, Ar, $O_2$, $N_2O$ or NO and mixtures thereof. The pressure during annealing can be, but is not limited to, 40 Torr.

Annealing may also be performed simultaneously with any one of commonly used processing steps such as Si gate electrode deposition or implant activation anneal. This may result in a more efficient manufacturing process, as separate anneal step is not used to effect the structural transformation of the dielectric layer to the desired crystalline cubic phase.

Furthermore, the substrate may be pretreated such that the surface layer is susceptible for the deposition of the dielectric layer. For example, the substrate can be OH terminated (Si-OH surface) such that the deposition of the dielectric material can be performed by atomic layer deposition.

When the substrate is silicon, the substrate may be covered with a thin interfacial $SiO_2$ layer (providing a fully or partially OH terminated surface) with a thickness of less than 5 nm, and in certain embodiments, less than 1.5 nm. In some embodiments, two types of interfacial oxides may be used. One type of interfacial oxide that may be used is a chemical oxide obtained by an $O_3$-based clean. Another type of oxide that may be used is a thermally grown oxide using a rapid thermal oxidation (RTO) process at 650° C. It will, of course, be appreciated that chemical oxides and thermal oxides may be obtained by other methods and/or processing conditions and that interfacial layers produced by such variations can provide similar advantages for the deposition of high-k layers as the embodiments discussed herein. For example, such interfacial layers could be deposited on any number of other surfaces such as H-terminated Si, metals and others.

While certain features of the invention have been illustrated and described herein, many modifications, substitutions, changes and equivalents will now occur to those skilled in the art. It is, therefore, to be understood that the appended claims are intended to cover all such modifications and changes as fall within the true spirit of the invention.

What is claimed is:

1. A device comprising:
   a gate electrode,
   a substrate having a top surface underlying the gate electrode, and
   a dielectric layer interposed between the gate electrode and the top surface, the dielectric layer comprising a composition including $HfO_2$ and a second compound, wherein at least a portion of the composition is in a cubic crystallographic phase.

2. The device of claim 1, further comprising a channel region,
   the channel region underlying the dielectric layer.

3. The device of claim 1, further comprising a second electrode,
   the second electrode underlying the dielectric layer.

4. The device of claim 1, wherein a dielectric constant of the dielectric layer is higher than a dielectric constant of pure $HfO_2$.

5. The device of claim 1, wherein the composition is stable at temperatures below 1200 degrees C.

6. The device of claim 1, wherein the second compound comprises one of a metal oxide or a metal oxynitride.

7. The device of claim 1, wherein the second compound comprises $Al_2O_3$.

8. The device of claim 1, wherein the amount of the second compound is between 1 [mol]% and 50 [mol]%.

9. The device of claim 1, wherein the dielectric layer has a thickness between 5 and 100 angstroms.

10. The device of claim 1, wherein the dielectric layer has an equivalent oxide thickness between 0.5 and 15 angstroms.

11. The device of claim 1, further comprising an interfacial layer between the dielectric layer and the substrate.

* * * * *